(12) United States Patent
Shibata

(10) Patent No.: US 7,880,864 B2
(45) Date of Patent: Feb. 1, 2011

(54) STAGE APPARATUS, EXPOSURE APPARATUS, AND DEVICE MANUFACTURING METHOD

(75) Inventor: Yugo Shibata, Utsunomiya (JP)

(73) Assignee: Canon Kabusiki Kaisha (JP)

( * ) Notice: Subject to any disclaimer, the term of this patent is extended or adjusted under 35 U.S.C. 154(b) by 538 days.

(21) Appl. No.: 11/964,248

(22) Filed: Dec. 26, 2007

(65) Prior Publication Data

US 2008/0158539 A1  Jul. 3, 2008

(30) Foreign Application Priority Data

Dec. 27, 2006  (JP) ............... 2006-353175
Dec. 18, 2007  (JP) ............... 2007-326587

(51) Int. Cl.
G03B 27/58 (2006.01)
G03B 27/62 (2006.01)

(52) U.S. Cl. ............... 355/72; 355/75

(58) Field of Classification Search ........... 355/72, 355/75, 53

See application file for complete search history.

(56) References Cited

U.S. PATENT DOCUMENTS 6,903,468 B2  6/2005  Korenaga

2003/0007140 A1 *  1/2003  Korenaga ............... 355/72

FOREIGN PATENT DOCUMENTS

| JP | 2004-079639   | 3/2004 |
| JP | 2004-254489   | 9/2004 |
| JP | 2005-033214 A | 2/2005 |
| JP | 2006-253707 A | 9/2006 |

OTHER PUBLICATIONS

Office Action issued in corresponding Korean Patent Application No. 10-2007-0134936 dated Jul. 23, 2009.

* cited by examiner

*Primary Examiner*—Peter B Kim
(74) *Attorney, Agent, or Firm*—Rossi, Kimms & McDowell LLP

(57) ABSTRACT

This invention relates to a stage apparatus including a first stage, a second stage mounted on the first stage, a first actuator which drives the first stage in a first direction, and a second actuator which drives the second stage such that the second stage moves relative to the first stage. The stage apparatus also includes a first unit including a first movable magnet arranged at an end of the first stage in the first direction, and a first stationary magnet which faces the first movable magnet and generates a repulsive force against the first movable magnet. The stage apparatus also includes a second unit including a second movable magnet arranged at the two ends of the second stage in the first direction, and a second stationary magnet which faces the second movable magnet and generates a repulsive force against the second movable magnet.

9 Claims, 17 Drawing Sheets

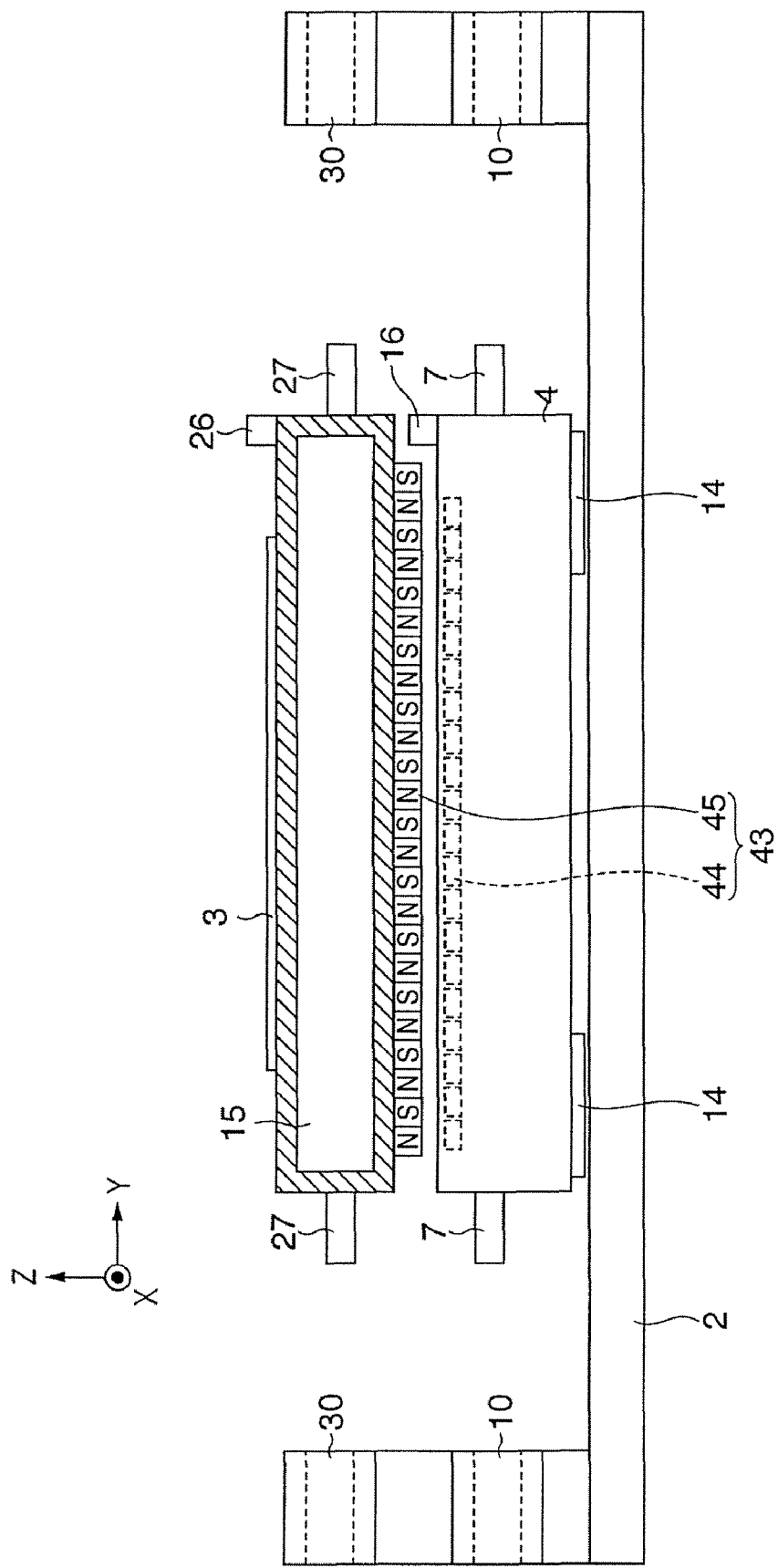

Prior Art

Prior Art

STAGE APPARATUS, EXPOSURE APPARATUS, AND DEVICE MANUFACTURING METHOD

BACKGROUND OF THE INVENTION

1. Field of the Invention

The present invention relates to a stage apparatus, an exposure apparatus, and a device manufacturing method.

2. Description of the Related Art

Japanese Patent Laid-Open No. 2004-79639 discloses a conventional alignment stage apparatus which mounts a repulsion magnet unit.

FIG. 11A is a perspective view showing an alignment stage apparatus according to a prior art. In this alignment stage apparatus, a base guide is fixed on a main body base, and a stage 103 which mounts a processing object 102 is supported to be movable in one axial direction with respect to the base guide. A bearing inserted between the upper surface of the base guide and the lower surface of the stage 103 regulates the orientation of the stage 103. Linear motor movable elements 105 are fixed on the two sides of the stage 103. A linear motor stator 106 faces the linear motor movable element 105 in a noncontact manner, and is fixed on the main body base. The position of the stage 103 is measured by irradiating a reflection mirror with light from a laser interferometer.

This alignment stage apparatus comprises repulsion magnet units shown in FIG. 11B. Repulsion movable elements 133 each including a movable magnet holder 131 and movable magnet 132 are fixed on the front and back sides of the stage 103. The movable magnet 132 is a plate-like permanent magnet magnetized in the vertical direction. In this prior art, the upper surface of the movable magnet 132 is magnetized into an N pole. The repulsion movable element 133 interacts with a repulsion stator 135 arranged on the base guide 101 to apply a repulsive force to the stage 103, thereby accelerating or decelerating it.

This repulsion magnet unit has a structure in which upper and lower magnets 137 sandwich the respective pole faces of the movable magnet 132 from both sides so as to cancel a repulsive force in the direction in which they face each other. The repulsion stators 135 which apply accelerating and decelerating forces to the stage 103 are fixed on the base guide in correspondence with the repulsion movable elements 133. The repulsion stator 135 is set at each end of the stroke region of the stage 103.

The interval between the upper and lower magnets 137 is slightly wider than the thickness of the movable magnet 132, while the inner interval between two side yokes 138 is wider than the width of the movable magnet 132. The movable magnet 132 can be inserted into a hole in a non-contacting manner, which is formed among the pair of upper and lower magnets 137 and two side yokes 138.

When the repulsion movable element 133 is present at a dotted position, it receives a repulsive force in the direction indicated by an arrow A. As the repulsion movable element 133 is pushed out from the dotted position upon receiving the repulsive force in the direction indicated by the arrow A, the magnitude of the repulsive force decreases. When the repulsion movable element 133 separates from the repulsion stator 135 to a certain extent, the magnitude of the repulsive force becomes zero. Since the stage 103 has already been accelerated to a maximum speed and is guided by the bearing, it moves to the opposite side while keeping the speed at this time.

The linear motor movable element 105 produces a force so that the stage 103 keeps a constant speed against deceleration attributed to the air resistance and bearing. The kinetic energy of the stage 103 is conserved until the repulsion movable element 133 on the opposite side of the stage 103 interacts with the repulsion stator 135 at the other end. Hence, the speed of the repulsion movable element 133 on the opposite side of the stage 103 also becomes zero while it is inserted into the repulsion stator 135 at the other end by the same amount of insertion as that at the dotted position shown in FIG. 11B.

In recent years, a stage apparatus mounted in an exposure apparatus is required to drive at a higher acceleration to improve the throughput, while it is desired to perform alignment with a higher accuracy to increasingly micropattern semiconductors. Under the circumstances, there is proposed a stage apparatus which has a configuration of coarse and fine motions, and which includes a coarse motion stage for long stroke movement and a fine motion stage for accurate alignment.

Unfortunately, the conventional alignment stage apparatuses have a demerit that a linear motor for a fine motion stage generates heat in large quantities upon driving a coarse motion stage at high accelerations. The linear motor for the fine motion stage utilizes a Lorentz force, so it is excellent in response and vibration isolation characteristics, but generates heat in relatively large quantities as compared with other actuators. The heat generation is problematic especially in acceleration and deceleration. In scanning exposure, the coarse motion stage accelerates first. As the coarse motion stage reaches a maximum speed, exposure is performed while it travels at a constant speed. After the exposure, the coarse motion stage decelerates. This sequence is repeated. The fine motion linear motor must apply a thrust having a magnitude defined by "(the mass of the fine motion stage)×(the acceleration of the fine motion stage)" to the fine motion stage in accelerating and decelerating the coarse motion stage. Upon accelerating or decelerating the coarse motion stage, the fine motion linear motor generates heat and then the ambient air fluctuates to result in a measurement error of an interferometer, or the fine motion stage deforms due to heat generated by the fine motion linear motor. This deteriorates the alignment accuracy of the fine motion stage. Another problem is that the acceleration of the coarse motion stage must be limited to suppress heat generation by the fine motion stage, resulting in a decrease in throughput.

An electromagnetic coupling using a force produced by an electromagnet is also proposed as a means for transmitting accelerating and decelerating forces between the coarse motion stage and the fine motion stage. However, the electromagnetic coupling requires an enormous amount of electric power to transmit an accelerating force produced in greatly accelerating the coarse motion stage, resulting in an increase in the amount of heat generation. Another problem is that the shape of the fine motion stage becomes complicated. This makes it difficult to raise the frequency range of the servo gain.

SUMMARY OF THE INVENTION

It is an object of the present invention to suppress heat generation by a driving actuator in a stage apparatus including a first stage and a second stage mounted on it.

A stage apparatus according to the present invention is characterized by comprising a first stage, a first actuator which drives the first stage in a first direction, a second stage mounted on the first stage, a second actuator which drives the second stage such that the second stage moves relative to the first stage, a first unit including a first movable magnet arranged at an end of the first stage in the first direction, and a first stationary magnet which faces the first movable magnet and generates a repulsive force against the first movable magnet, and a second unit including a second movable magnet arranged at two ends of the second stage in the first direction, and a second stationary magnet which faces the second movable magnet and generates a repulsive force against the second movable magnet.

According to the present invention, it is possible to suppress heat generation by a driving actuator in a stage apparatus including a first stage and a second stage mounted on it.

Further features of the present invention will become apparent from the following description of exemplary embodiments with reference to the attached drawings.

BRIEF DESCRIPTION OF THE DRAWINGS

FIG. 10A is a sectional view showing a stage apparatus according to the third embodiment;

DESCRIPTION OF THE EMBODIMENTS

First Embodiment

Figure 1:
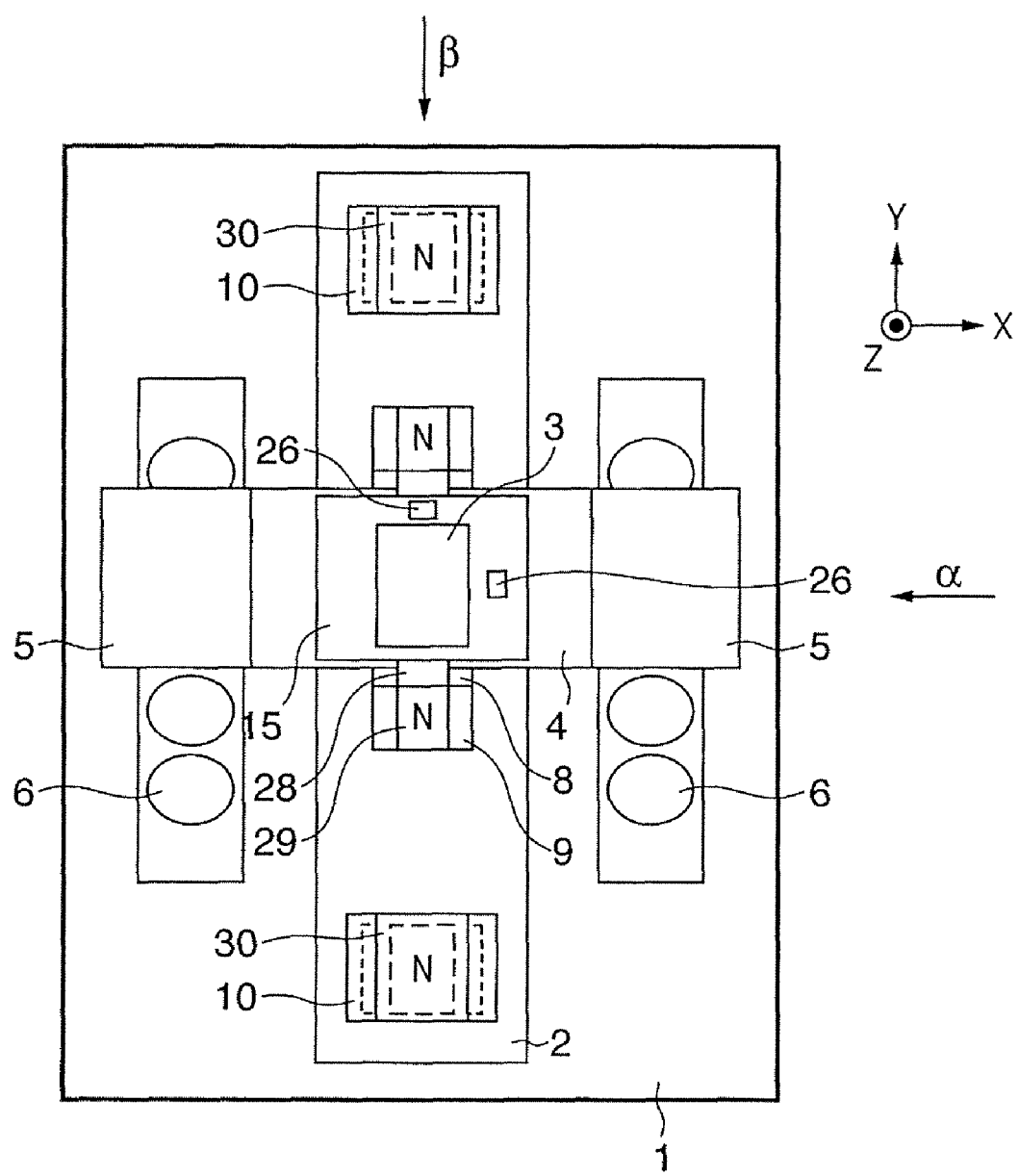
FIG. 1 is a plan view showing a stage apparatus according to the first embodiment.
Figure 2:
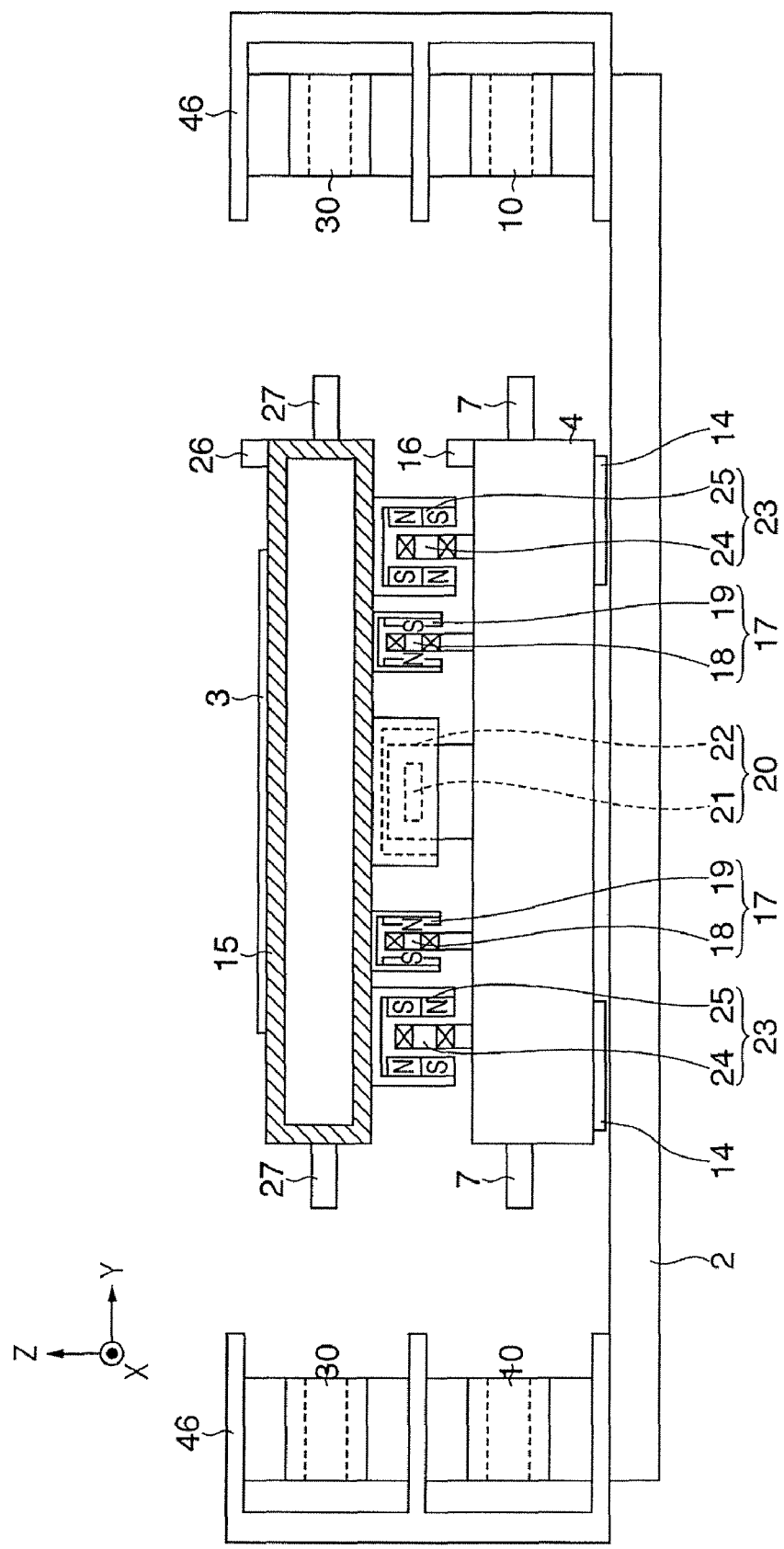
FIG. 2 is a sectional view showing the stage apparatus according to the first embodiment.
Figure 3:
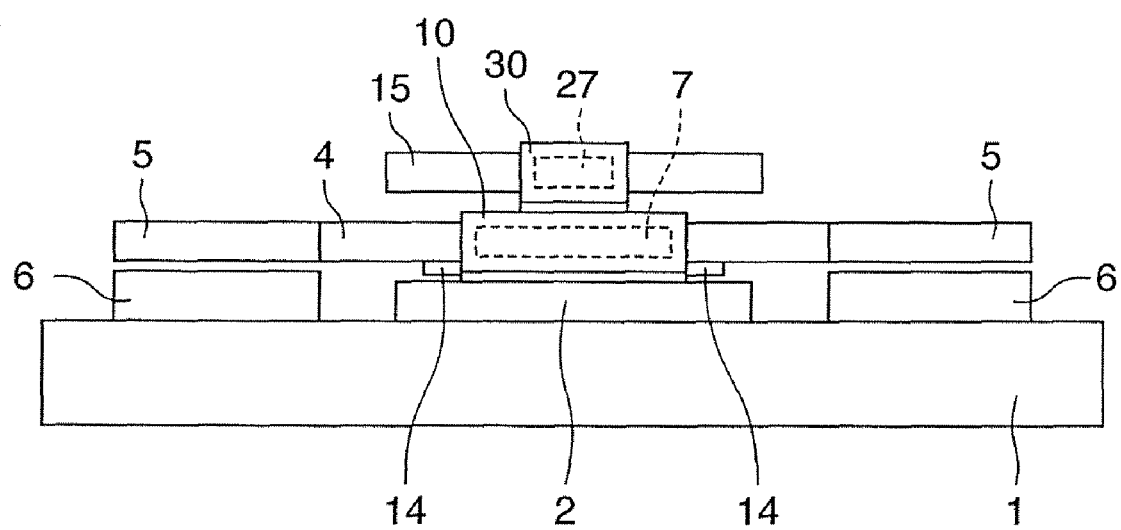
FIG. 3 is a front view showing the stage apparatus according to the first embodiment.
Figure 4:
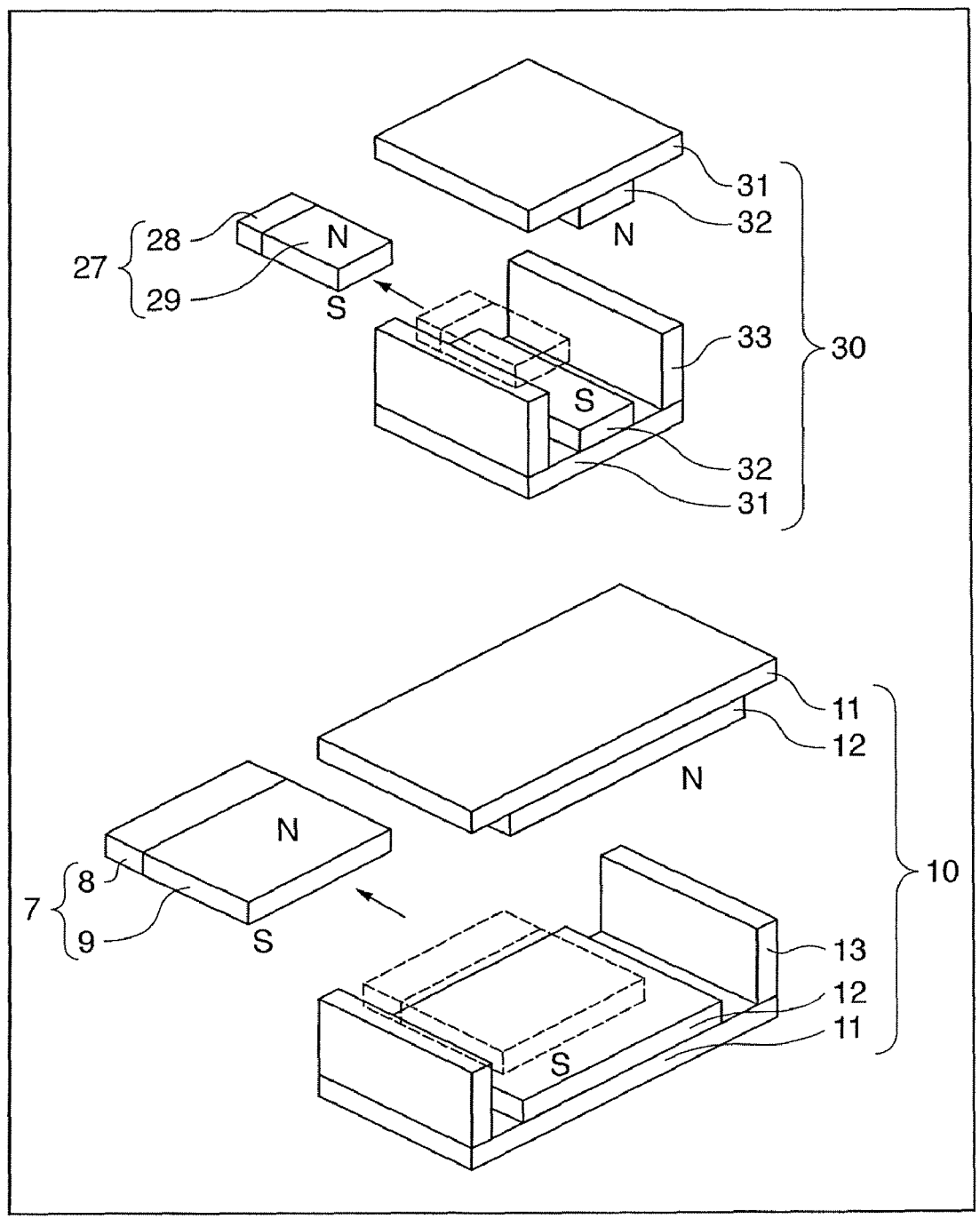
FIG. 4 is a perspective view showing a repulsive force generator according to the first embodiment.

FIG. 1 is a plan view showing a stage apparatus according to the first embodiment of the present invention. FIG. 2 is a side view (sectional view) when seen from the direction indicated by an arrow α in FIG. 1. FIG. 3 is a front view when seen from the direction indicated by an arrow β. FIG. 4 is a perspective view showing a repulsive force generator. In this stage apparatus, a base guide 2 is fixed on a main body base 1, and a coarse motion stage (first stage) 4 which mounts a processing object 3 is supported to be movable in one axial direction with respect to the base guide 2. A bearing 14 inserted between the upper surface of the main body base 1 and the lower surface of the coarse motion stage 4 regulates the orientation of the coarse motion stage 4. An exposure apparatus which requires high alignment accuracy adopts an air bearing as the bearing 14. Coarse motion linear motor movable elements 5 are fixed on the two sides of the coarse motion stage 4. A coarse motion linear motor stator 6 faces the coarse motion linear motor movable element 5 in a non-contacting manner, and is fixed on the main body base 1. The coarse motion linear motor movable element 5 and coarse motion linear motor stator 6 constitute a first actuator for driving the first stage serving as the coarse motion stage in the Y direction (first direction). The first actuator is not limited to a linear motor. The first direction may be the X direction. The position of the coarse motion stage 4 is measured by irradiating a coarse motion reflection mirror 16 with light from a laser interferometer.

Via fine motion linear motors 17 to 25 and a self-weight compensating mechanism (not shown), a fine motion stage (second stage) 15 which mounts the processing object 3 is mounted on the coarse motion stage 4 to be movable in six axial directions.

As shown in FIG. 2, two fine motion X linear motors 17 each including a fine motion X linear motor stator 18 and fine motion X linear motor movable element 19 are interposed between the fine motion stage 15 and the coarse motion stage 4. Two fine motion Y linear motors 20 each including a fine motion Y linear motor stator 21 and fine motion Y linear motor movable element 22 are also interposed between them. Three fine motion Z linear motors 23 each including a fine motion Z linear motor stator 24 and fine motion Z linear motor movable element 25 are also interposed between them. The fine motion Y linear motor constitutes a second actuator for driving the second stage serving as the fine motion stage in the Y direction (first direction). The second actuator is not limited to a linear motor. The first direction may be the X direction.

Each linear motor movable element faces the corresponding linear motor stator in a non-contacting manner. Each linear motor stator is fixed on the upper surface of the coarse motion stage 4, while each liner motor movable element is fixed on the lower surface of the fine motion stage 15. The position of the fine motion stage 15 is measured by irradiating a fine motion reflection mirror 26 with light from a laser interferometer. Each linear motor generates a thrust using the so-called Lorentz force in a non-contacting manner. Using these linear motors, the fine motion stage 15 is accurately aligned along six axes, that is, the X-, Y-, Z-, ωx-, ωy-, and ωz-axes. The self-weight compensating mechanism (not shown) supports the weight of the fine motion stage 15. For this reason, the fine motion Z linear motor 23 need not generate a thrust to support the weight of the fine motion stage 15, and need only generate a minimal force to correct a shift from a target position.

This stage apparatus comprises a coarse motion repulsive force generator (first unit) and a fine motion repulsive force generator (second unit) shown in FIG. 4. Coarse motion repulsion movable elements (first movable magnets) 7 each including a coarse motion movable magnet holder 8 and coarse motion movable magnet 9 are fixed on the two sides of the coarse motion stage 4 in the Y direction. The coarse motion movable magnet 9 is a plate-like permanent magnet magnetized in the vertical direction. In this embodiment, the upper surface of the coarse motion movable magnet 9 is magnetized into an N pole. The coarse motion repulsion movable element 7 interacts with a coarse motion repulsion stator (first stationary magnet) 10 arranged on the base guide 2 to apply a repulsive force to the coarse motion stage 4, thereby accelerating or decelerating it. That is, the coarse motion repulsion movable element (first movable magnet) 7 and the coarse motion repulsion stator (first stationary magnet) 10 constitute a coarse motion repulsive force generator (first unit).

Similarly, fine motion repulsion movable elements (second movable magnets) 27 each including a fine motion movable magnet holder 28 and fine motion movable magnet 29 are fixed on the two sides of the fine motion stage 15 in the Y direction. The fine motion movable magnet 29 is a plate-like permanent magnet magnetized in the vertical direction. In this embodiment, the upper surface of the fine motion movable magnet 29 is magnetized into an N pole. The fine motion repulsion movable element 27 interacts with a fine motion repulsion stator (second stationary magnet) 30 arranged on the base guide 2 to apply a repulsive force to the fine motion stage 15, thereby accelerating or decelerating it. That is, the fine motion repulsion movable element (second movable magnet) 27 and the fine motion repulsion stator (second stationary magnet) 30 constitute a fine motion repulsive force generator (second unit).

A feature of the above-described arrangement of each repulsive force generator is that the direction in which it generates a repulsive force is perpendicular to the magnetization direction of the permanent magnet. For example, even when identical poles of magnets magnetized in the Y direction are made to face each other, it is possible to obtain a repulsive force in the Y direction. In this case, however, the distance along which a repulsive force can have an influence is so short that the coarse motion stage 4 cannot reach a sufficiently high speed. In contrast, as shown in FIG. 4, magnets of the same polarity are made to face each other to utilize a force generated in a direction perpendicular to the direction in which they face each other. This makes it possible to obtain a force generation stroke corresponding to the sizes of the magnets of the same polarity which face each other. In addition, this coarse motion repulsive force generator has a structure in which upper and lower magnets 12 sandwich the respective pole faces of the coarse motion movable magnet 9 from both sides. This makes it possible to cancel a repulsive force in the direction in which they face each other. Similarly, the fine motion repulsive force generator has a structure in which upper and lower magnets 32 sandwich the respective pole faces of the fine motion movable magnet 29 from both sides. This makes it possible to cancel a repulsive force in the direction in which they face each other.

Let M be the mass of the coarse motion stage 4, m be the mass of the fine motion stage 15, and a be the acceleration of each stage. A force F necessary to accelerate the coarse motion stage 4 at the acceleration a, and a force f necessary to accelerate the fine motion stage 15 at the acceleration a are given by:

$$F = M \times a \quad (1)$$

$$f = m \times a \quad (2)$$

Since the acceleration a takes the same value in equations (1) and (2), the ratio between the forces F and f to be generated is equal to the mass ratio as given by:

$$F:f = M:m \quad (3)$$

That is, the sizes of the magnets of the same polarity of each repulsive force generator are determined such that the ratio between a repulsive force generated by the coarse motion repulsive force generator and the one generated by the fine motion repulsive force generator becomes equal to the ratio between the mass of the coarse motion stage 4 and that of the fine motion stage 15.

Figure 5:
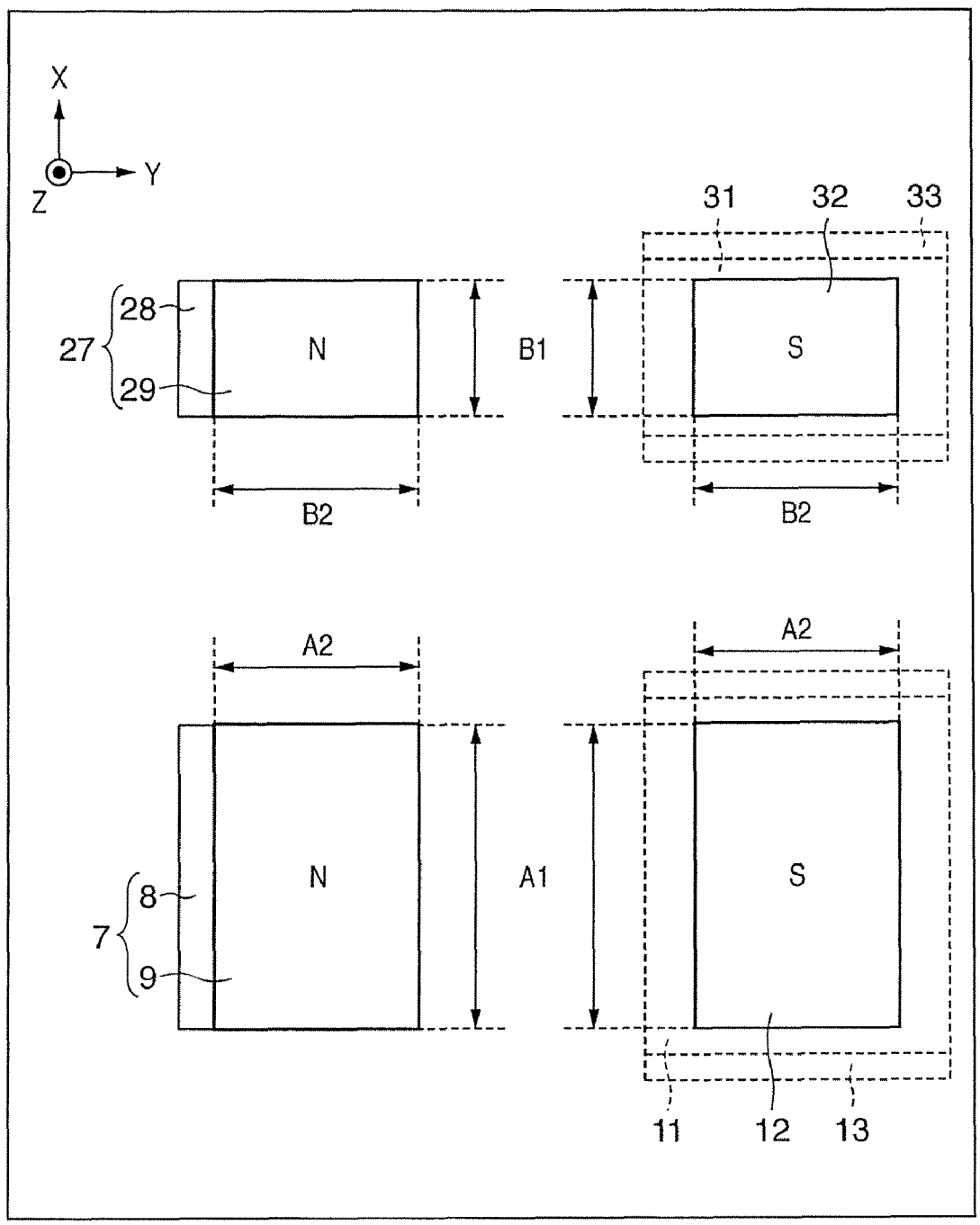
FIG. 5 is a plan view showing the repulsive force generator according to the first embodiment.

FIG. 5 is a plan view showing the coarse motion repulsive force generator and fine motion repulsive force generator when viewed from above. For descriptive convenience, upper yokes and the upper magnets are not illustrated in FIG. 5.

As shown in FIG. 5, let A1 be the dimension (width) of the coarse motion movable magnet 9 in the X direction, A2 be the dimension (length) of the coarse motion movable magnet 9 in the Y direction, B1 be the dimension (width) of the fine motion movable magnet 29 in the X direction, and B2 be the dimension (length) of the fine motion movable magnet 29 in the Y direction.

In this embodiment, the dimensions of the magnets of the repulsive force generators are defined by:

$$A2 = B2 \quad (4)$$

$$A1:B1 = M:m \quad (5)$$

That is, the dimension (length) of the coarse motion movable magnet 9 in the Y direction is equal to that of the fine motion movable magnet 29. The ratio between the dimension (width) of the coarse motion movable magnet 9 in the X direction and that of the fine motion movable magnet 29 is also equal to the ratio between the mass of the coarse motion stage 4 and that of the fine motion stage 15. Then, the relationship between the repulsive forces F and f generated by the coarse motion and fine motion repulsive force generators satisfies:

$$F:f = M:m \quad (6)$$

Therefore, the coarse motion stage having the mass M and the fine motion stage having the mass m are accelerated at the same acceleration a.

Similarly, the magnitudes of repulsive forces generated by the fine motion repulsive force generator and coarse motion repulsive force generator can be changed by, for example, changing the sizes or thicknesses of the repulsion movable elements, changing the sizes or thicknesses of the magnets of the repulsion stators, which face each other, or changing the insertion amounts of the repulsion movable elements. The sizes of the magnets of the same polarity of each repulsive force generator may be determined in the above-described way such that the ratio between a repulsive force generated by the fine motion repulsive force generator and the one generated by the coarse motion repulsive force generator becomes equal to the ratio between the mass of the fine motion stage and that of the coarse motion stage.

With this arrangement, each repulsive force generator can apply the same accelerating force to the corresponding stage. Since the relative speed between the coarse motion stage 4 and the fine motion stage 15 becomes zero, the fine motion Y linear motor movable element 22 need not generate a force. This makes it possible to suppress heat generation by the fine motion linear motor.

As shown in FIG. 3, the coarse motion repulsion stator 10 for applying accelerating and decelerating forces to the coarse motion stage 4 is fixed on the base guide 2 in correspondence with the coarse motion repulsion movable element 7. Similarly, the fine motion repulsion stator 30 for applying accelerating and decelerating forces to the fine motion stage 15 is fixed on the base guide 2 in correspondence with the fine motion repulsion movable element 27. The coarse motion repulsion stator 10 and fine motion repulsion stator 30 are set at each end of the stroke region on the base guide 2.

FIG. 4 is a perspective view showing the repulsive force generator alone. The coarse motion repulsion stator 10 includes, as a magnet assembly, an upper yoke 11, upper magnet 12, two side yokes 13, lower magnet 12, and lower yoke 11. The upper and lower magnets 12 are plate-like permanent magnets magnetized in the vertical direction, like the coarse motion repulsion movable element 7. The poles of the coarse motion repulsion stator 10 face identical poles of the coarse motion repulsion movable element 7. In other words, the lower surface of the upper magnet 12 corresponds to an N pole, while the upper surface of the lower magnet 12 corresponds to an S pole. The upper yoke 11, side yokes 13, and lower yoke 11 are provided so that the magnetic fluxes of the upper and lower magnets 12 run through them sideways. The interval between the upper and lower magnets 12 is slightly wider than the thickness of the coarse motion movable magnet 9, while the inner interval between the two side yokes 13 is wider than the width of the coarse motion movable magnet 9. The coarse motion movable magnet 9 can be inserted into a hole in a non-contacting manner, which is formed among the pair of upper and lower magnets 12 and two side yokes 13.

Similarly, the fine motion repulsion stator 30 includes, as a magnet assembly, an upper yoke 31, upper magnet 32, two side yokes 33, lower magnet 32, and lower yoke 31. The upper and lower magnets 32 are plate-like permanent magnets magnetized in the vertical direction, like the coarse motion repulsion movable element 7. The poles of the fine motion repulsion stator 30 face identical poles of the fine motion repulsion movable element 27. In other words, the lower surface of the upper magnet 32 corresponds to an N pole, while the upper surface of the lower magnet 32 corresponds to an S pole. The upper yoke 31, side yokes 33, and lower yoke 31 are provided so that the magnetic fluxes of the upper and lower magnets 32 run through them sideways. The interval between the upper and lower magnets 32 is slightly wider than the thickness of the fine motion movable magnet 29, while the inner interval between the two side yokes 33 is wider than the width of the fine motion movable magnet 29. The fine motion movable magnet 29 can be inserted into a hole in a non-contacting manner, which is formed among the pair of upper and lower magnets 32 and two side yokes 33.

When the coarse motion repulsion movable element 7 and fine motion repulsion movable element 27 are present at a dotted position, they each receive a repulsive force in the direction indicated by an arrow. As the coarse motion repulsion movable element 7 is pushed out from the dotted position upon receiving the repulsive force in the direction indicated by the arrow, the magnitude of the repulsive force decreases. When the coarse motion repulsion movable element 7 separates from the coarse motion repulsion stator 10 to a certain extent, the magnitude of the repulsive force becomes zero. Since the coarse motion stage 4 has already been accelerated to a maximum speed and is guided by the bearing 14, it moves to the opposite side while keeping the speed at this time. Similarly, as the fine motion repulsion movable element 27 is pushed out from the dotted position upon receiving the repulsive force in the direction indicated by the arrow, the magnitude of the repulsive force decreases. When the fine motion repulsion movable element 27 separates from the fine motion repulsion stator 30 to a certain extent, the magnitude of the repulsive force becomes zero. Since the fine motion stage 15 has already been accelerated to a maximum speed, the relative speed between the fine motion stage 15 and the coarse motion stage 4 is zero. The fine motion stage 15 moves to the opposite side while keeping the speed at this time.

The coarse motion linear motor movable element 5 produces a force so that the coarse motion stage 4 keeps a constant speed against deceleration attributed to the air resistance and bearing. Similarly, the fine motion Y linear motor movable element 22 produces a force so that the fine motion stage 15 keeps a constant speed against deceleration attributed to, for example, the air resistance and the disturbance generated upon mounting it. The kinetic energies of the stages are conserved until the coarse motion repulsion movable element 7 on the opposite side of the coarse motion stage 4 and the fine motion repulsion movable element 27 on the opposite side of the fine motion stage 15 interact with the coarse motion repulsion stator 10 and fine motion repulsion stator 30, respectively, at the other ends. Hence, the speeds of both the coarse motion repulsion movable element 7 on the opposite side of the coarse motion stage 4 and the fine motion repulsion movable element 27 on the opposite side of the fine motion stage 15 become zero while they are inserted into the coarse motion repulsion stator 10 and fine motion repulsion stator 30, respectively, at the other ends by the same insertion amounts as those at the dotted position shown in FIG. 4.

To prevent interference between magnetic action forces generated between the coarse motion repulsive force generator and the fine motion repulsive force generator upon accelerating and decelerating the stages, a magnetic shield 46 desirably covers each repulsive force generator from above and below, as shown in FIG. 2. The magnetic shield 46 is desirably made of a high-permeability material such as soft iron, permalloy, or silicon steel.

Figure 6:
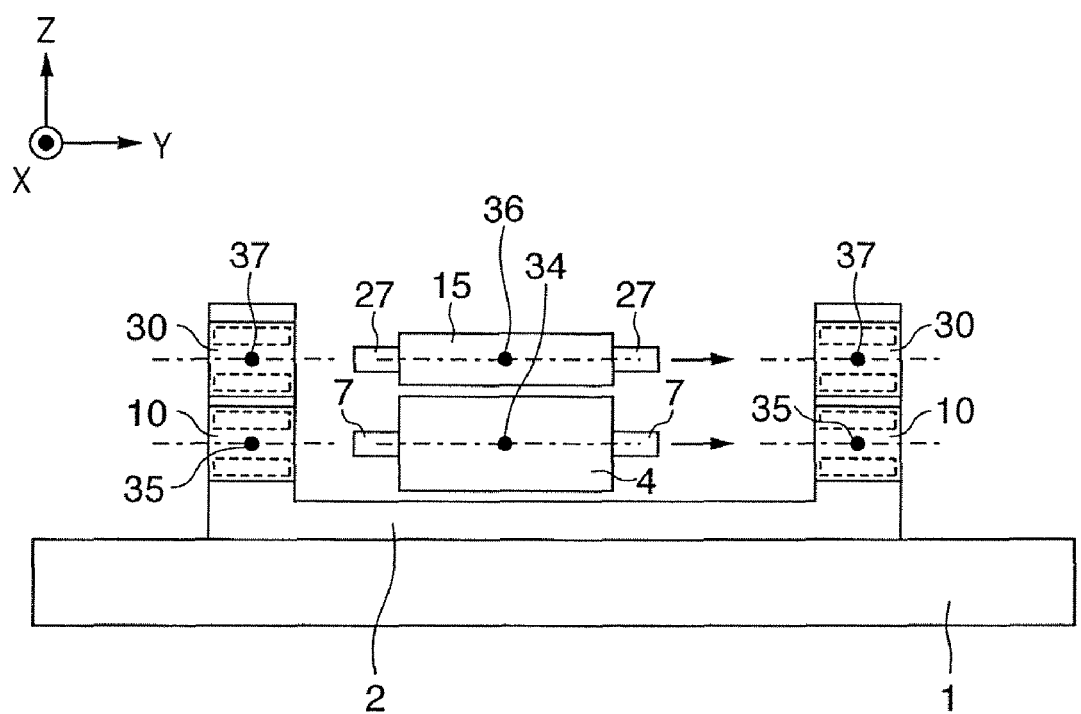
FIG. 6 is a side view showing the stage apparatus according to the first embodiment.

As shown in FIG. 6, a center of gravity 34 of the coarse motion stage 4 is matched with the points of action of the coarse motion repulsion movable element 7 and coarse motion repulsion stator 10. That is, the line of action of a repulsive force generated by the coarse motion repulsive force generator runs through the position of the overall center of gravity of the coarse motion stage and a member mounted on it. With this arrangement, rotational components generated by the repulsive force can be reduced. Similarly, a center of gravity 36 of the fine motion stage 15 is matched with the points of action of the fine motion repulsion movable element 27 and fine motion repulsion stator 30 so as to reduce rotational components generated by the repulsive force. This makes it possible to decrease errors of the repulsive forces applied to the coarse motion stage 4 and fine motion stage 15. It is also possible to suppress heat generation by the fine motion linear motor.

Figure 7:
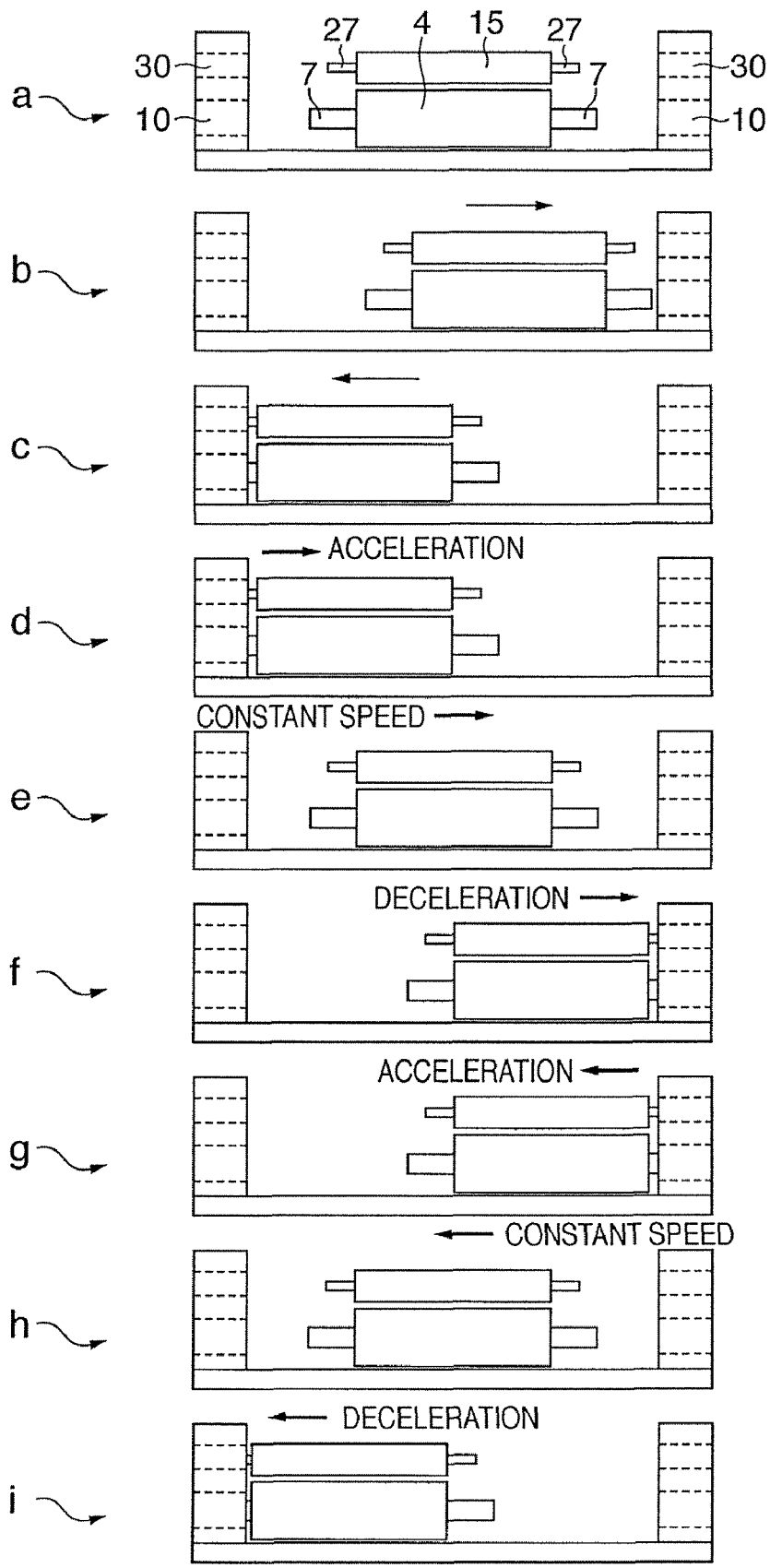
FIG. 7 is a view for explaining how to drive the stage apparatus according to the first embodiment.

FIG. 7 shows a driving unit according to the first embodiment. Assume that the driving unit is in a state in (a) upon power on. In (b), an electric current is supplied to the linear motor to drive the coarse motion stage 4 and fine motion stage 15 to positions farthest from the initial positions (repulsion start positions). This is to ensure an acceleration section in driving the coarse motion stage 4 and fine motion stage 15 to the initial positions (repulsion start positions) at the next time.

In (c), the coarse motion stage 4 and fine motion stage 15 are driven to the initial positions (repulsion start positions) with acceleration. The coarse motion repulsion movable element 7 is inserted at a predetermined position in the coarse motion repulsion stator 10, while the fine motion repulsion movable element 27 is inserted at a predetermined position in the fine motion repulsion stator 30. If the coarse motion repulsion movable element 7 and fine motion repulsion movable element 27 cannot be inserted at the predetermined positions in the coarse motion repulsion stator 10 and fine motion repulsion stator 30, respectively, by one accelerating motion, they are reciprocated with acceleration several times. The coarse motion repulsion movable element 7 and fine motion repulsion movable element 27 are thus driven with acceleration until they are inserted at the predetermined positions in the coarse motion repulsion stator 10 and fine motion repulsion stator 30, respectively.

In (d), the coarse motion repulsion movable element 7 and fine motion repulsion movable element 27 are inserted at the predetermined positions in the coarse motion repulsion stator 10 and fine motion repulsion stator 30, respectively (repulsion start positions). When the coarse motion stage 4 and fine motion stage 15 stop at zero speed, accelerating forces produced by repulsive forces act to drive them in the opposite direction.

In (e), the coarse motion repulsion movable element 7 and coarse motion repulsion stator 10 gradually separate from each other, while the fine motion repulsion movable element 27 and fine motion repulsion stator 30 gradually separate from each other. Since the repulsive forces no longer act on the coarse motion stage 4 and fine motion stage 15, they are driven at constant speeds. The coarse motion linear motor movable element 5 and fine motion Y linear motor 20 produce forces so that the stages keep constant speeds against deceleration attributed to the air resistance and bearing.

In (f), the coarse motion stage 4 and fine motion stage 15 reach the stroke end on the opposite side. The coarse motion repulsion movable element 7 and fine motion repulsion movable element 27 interact with the coarse motion repulsion stator 10 and fine motion repulsion stator 30, respectively, again. Since decelerating forces produced by repulsive forces act on the stages, they eventually stop at zero speed.

In (g), accelerating forces produced by repulsive forces act on the coarse motion stage 4 and fine motion stage 15 again to drive them in the opposite direction. Through a state in (h), in (i), the coarse motion repulsion movable element 7 and fine motion repulsion movable element 27 interact with the coarse motion repulsion stator 10 and fine motion repulsion stator 30, respectively, again. Since decelerating forces produced by repulsive forces act on the stages, they eventually stop at zero speed.

After that, the stages reciprocate between the repulsion stators on the two sides to repeatedly enter the states in (d) to (i).

The permanent magnets thus apply both accelerating and decelerating forces to the coarse motion stage 4 and fine motion stage 15 using repulsive forces. This makes it possible to minimize electric power to be supplied to the coarse motion linear motor and fine motion Y linear motor 20, thus suppressing heat generation. It is also possible to attain power saving.

Figure 8:
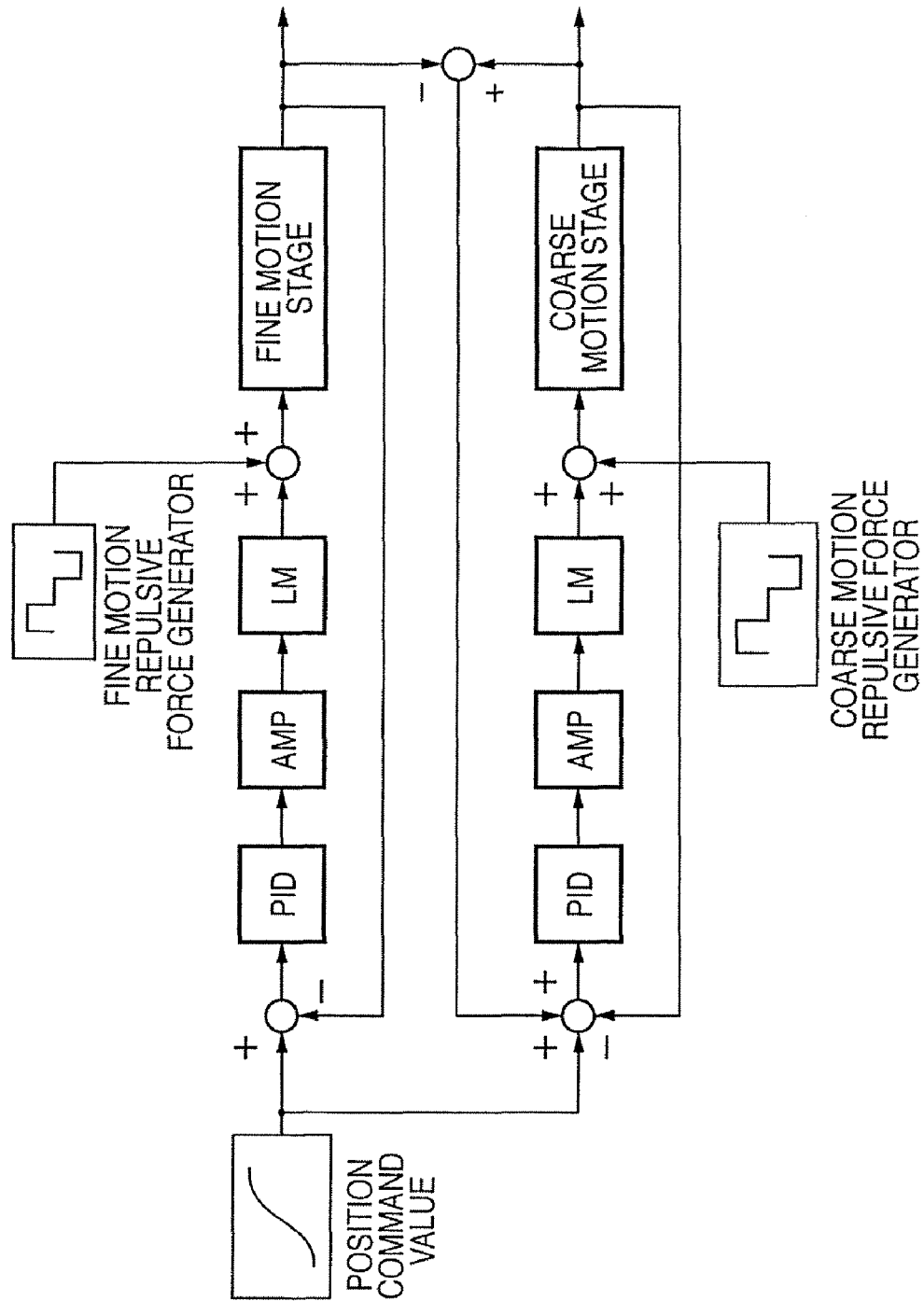
FIG. 8 is a control block diagram showing the stage apparatus according to the first embodiment.

FIG. 8 is a control block diagram according to the first embodiment. The acceleration of a coarse motion stage using a repulsive force generated by a coarse motion repulsive force generator sometimes becomes different from that of a fine motion stage using a repulsive force generated by a fine motion repulsive force generator, owing to magnetization nonuniformity or a dimensional error of a magnet of the repulsive forge generator or a shift in the center of gravity of the stage. In this case, as shown in FIG. 8, a coarse stage linear motor desirably changes the difference in acceleration between the fine motion stage and the coarse motion stage. This makes it possible to minimize electric power to be additionally supplied to a fine motion linear motor, thus suppressing its heat generation. Alternatively, a fine motion linear motor can change the difference in acceleration between the stages, or both the coarse motion linear motor and fine motion linear motor may be used to change it.

In the coarse motion repulsive force generator and the fine motion repulsive force generator described above, the movable magnet is inserted between the pair of stationary magnets. However, the present invention is not limited to such a configuration. The repulsive force generators are preferably arranged at the both ends of the stage. However, the repulsive force generator can be arranged at only one end of the stage. The repulsive force generator may have a configuration which includes a movable magnet arranged at the stage and a stationary magnet facing the movable magnet at an end of a stroke region of the stage, and applies a repulsive force acted between the movable magnet and the stationary magnet to the stage.

Second Embodiment

Figure 9A:
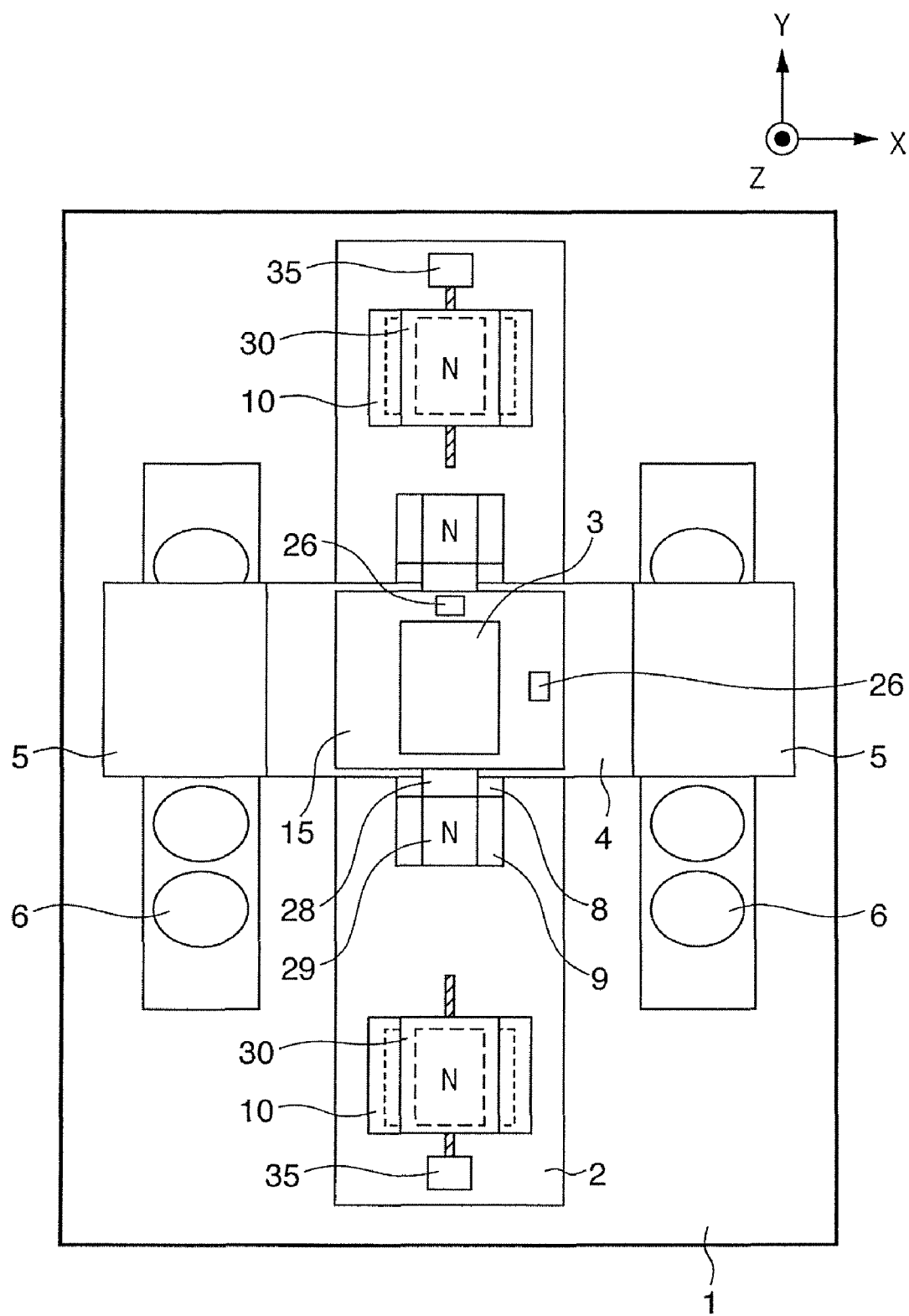
FIG. 9A is a plan view showing a stage apparatus according to the second embodiment.
Figure 9B:
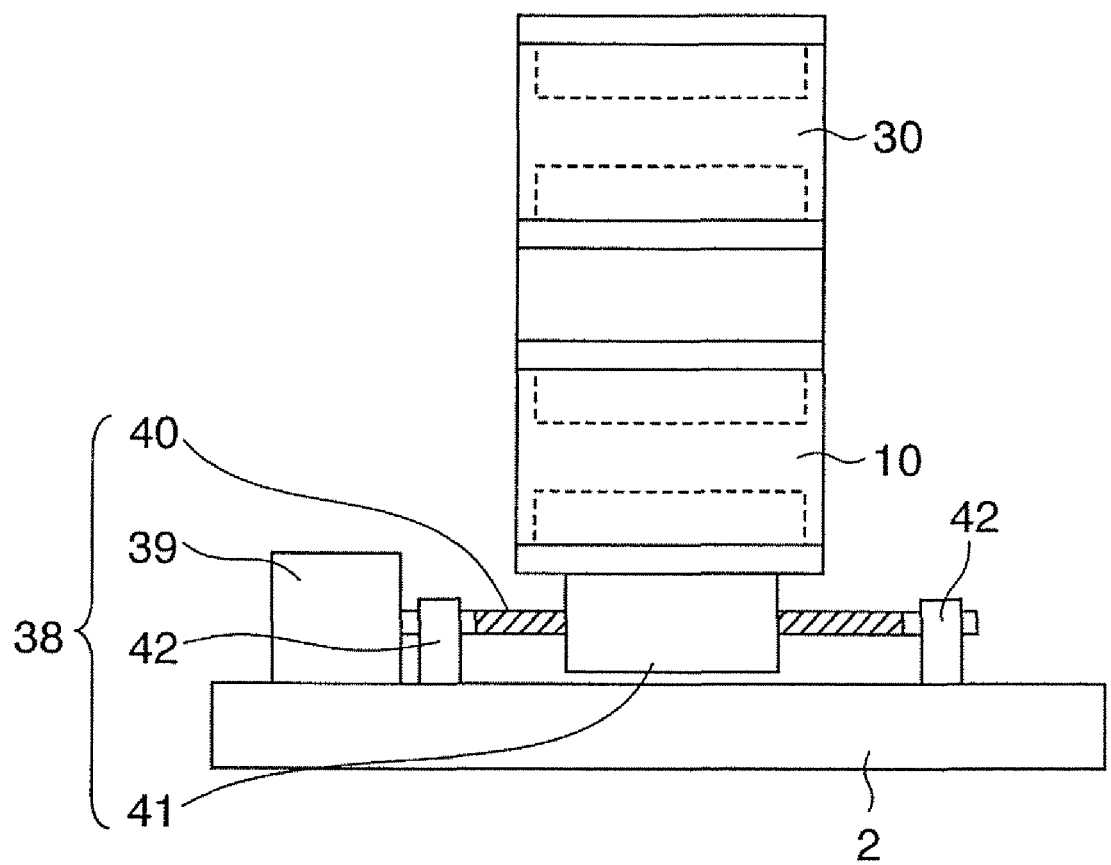
FIG. 9B is a view showing the arrangement of a driving unit for a repulsion stator according to the second embodiment.

FIG. 9A is a plan view showing a stage apparatus according to the second embodiment of the present invention. FIG. 9B shows a repulsion stator driving unit 38. The accelerating and decelerating motions of a coarse motion stage 4 and fine motion stage 15 using repulsive force generators are the same as those in the first embodiment.

Assume that the stage apparatus according to the present invention is applied to a reticle stage of a semiconductor exposure apparatus. In this case, the maximum speeds of the coarse motion stage 4 and fine motion stage 15 can be changed by changing the amounts of insertion of a coarse motion repulsion movable element 7 and fine motion repulsion movable element 27. In other words, to change the dose during exposure, it is only necessary to change the amount of insertion of the coarse motion repulsion movable element 7 into a coarse motion repulsion stator 10, and that of insertion of the fine motion repulsion movable element 27 into a fine motion repulsion stator 30 shown in (d) of FIG. 7.

Assume also that the entire pattern of a reticle as a processing object 3 is not transferred by exposure, for example, that a part or half of the pattern is transferred by exposure. In this case, it is necessary to change the positions of the reciprocating coarse motion stage 4 and fine motion stage 15, at which their acceleration and deceleration start. The operation shown in FIG. 7 has been explained assuming that the coarse motion repulsion stator 10 and fine motion repulsion stator 30 are fixed on the two sides of the base guide 2.

FIG. 9B shows the arrangement of the repulsion stator driving unit (stationary magnet driving unit) 38 which can change the positions of the coarse motion repulsion stator 10 and fine motion repulsion stator 30 using a generally known screw feed mechanism. A motor 39 and feed screw supporting unit 42 are fixed on the base guide 2. As the motor 39 rotates, a feed screw 40 connected coaxially with it rotates so as to change the positions of the coarse motion repulsion stator 10 and fine motion repulsion stator 30 via a feed screw nut 41. An encoder built in the motor 39 can detect the positions of the coarse motion repulsion stator 10 and fine motion repulsion stator 30.

This arrangement can change the positions of the reciprocating coarse motion stage 4 and fine motion stage 15, at which their acceleration and deceleration start. This makes it possible to quickly cope with, for example, a case in which a part of a reticle is to be exposed.

Third Embodiment

Along with the micropatterning of semiconductors, a demand for high-speed, high-accuracy stages is increasing. It is becoming harder for the conventional configuration of coarse and fine motions to ensure a required servo range of a stage. Under the circumstances, a guideless flat stage of six degrees of freedom capable of tilting and alignment in directions along the X-Y plane, in addition to the Z direction, is proposed to provide a stage system compatible with a high-speed, high-accuracy stage (Japanese Patent Laid-Open No. 2004-254489).

Figure 10B:
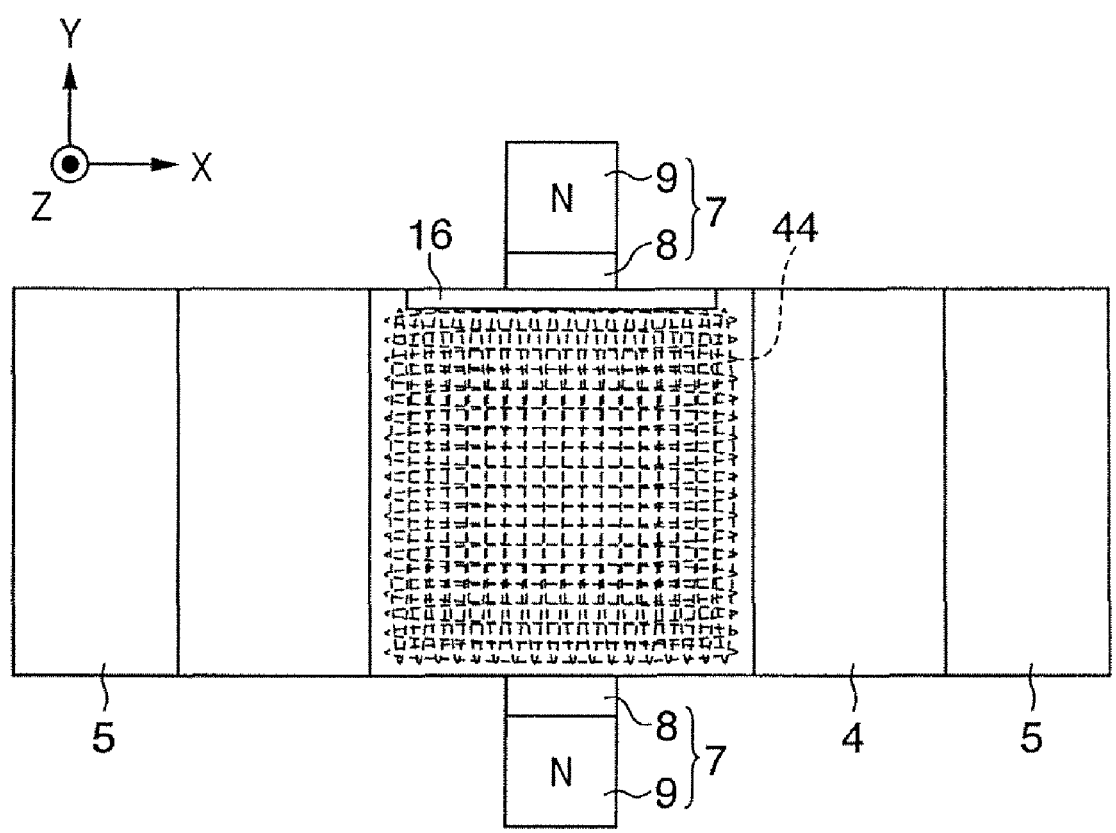
FIG. 10B is a plan view showing a coarse motion stage according to the third embodiment.
Figure 11A:
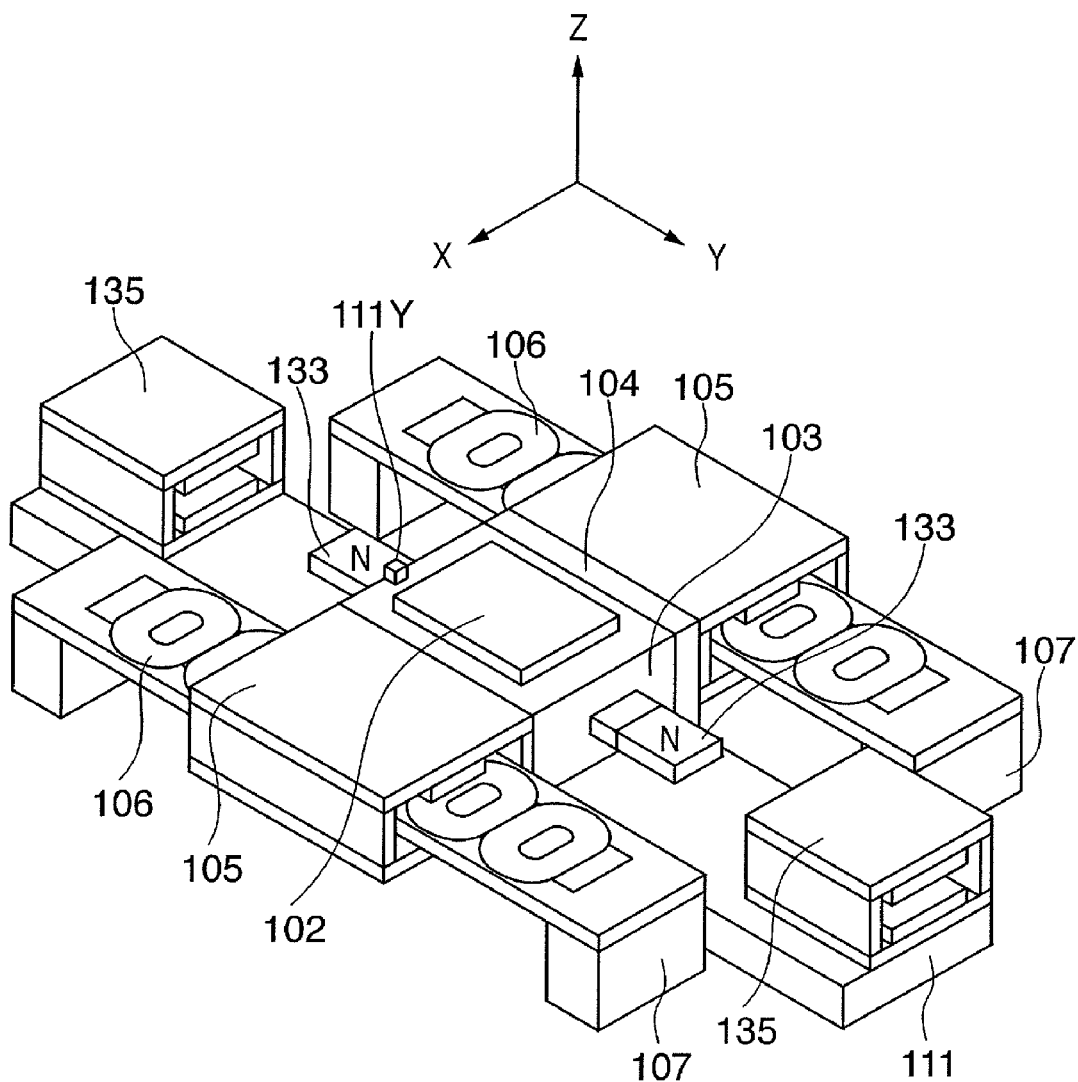
FIG. 11A is a perspective view showing a stage apparatus comprising an accelerating means using a repulsive force according to a prior art.
Figure 11B:
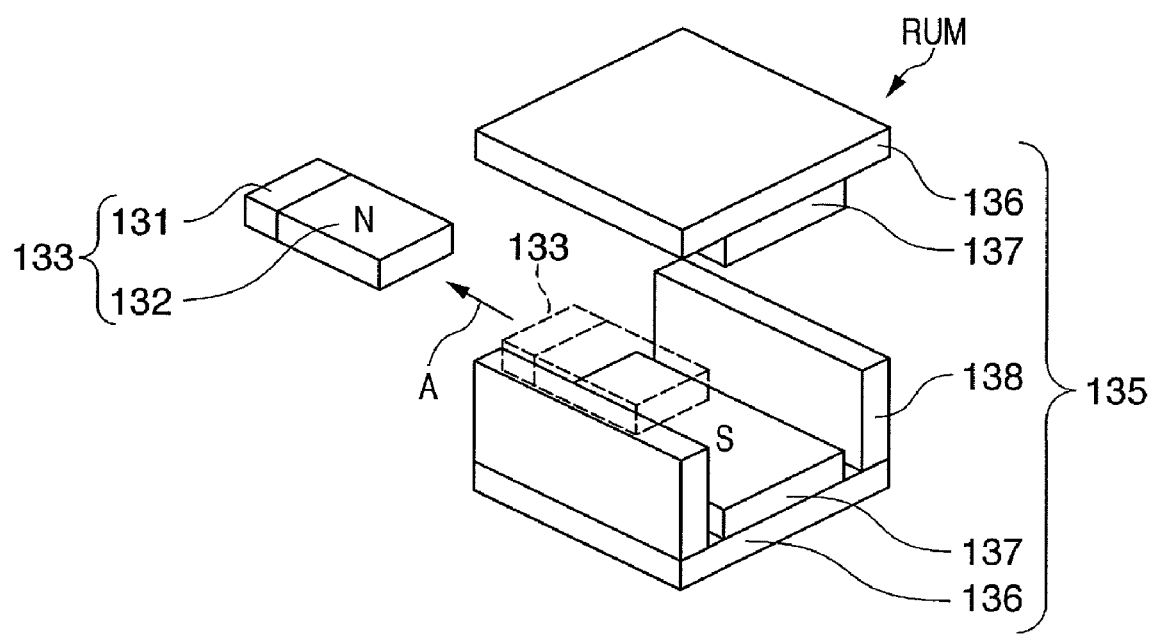
FIG. 11B is a perspective view showing a repulsion magnet unit according to the prior art.

FIGS. 10A and 10B are views showing the arrangement of a stage apparatus according to the third embodiment. FIG. 10A is a side view (sectional view), and FIG. 10B is a plan view of a coarse motion stage 4. A planar motor 43 is interposed between a fine motion stage 15 and the coarse motion stage 4. The planar motor 43 includes coils 44 as stators and magnets 45 as movable elements.

In the alignment apparatus shown in FIG. 10A, the coils 44 as stators are arranged on the upper surface of the coarse motion stage 4 in a grid pattern, while the magnets 45 as movable elements are similarly arranged on the lower surface of the fine motion stage 15 in a grid pattern. By supplying an electric current to at least one of the stator coils 44, the fine motion stage 15 can be driven upon obtaining a thrust of six degrees of freedom produced by a Lorentz force. The position of the fine motion stage 15 is measured by irradiating a fine motion reflection mirror 26 with light from a laser interferometer. Using this planar motor, the fine motion stage 15 is accurately aligned along six axes, that is, the X-, Y-, Z-, ωx-, ωy-, and ωz-axes. A self-weight compensating mechanism (not shown) supports the weight of the fine motion stage 15. For this reason, the planar motor 43 need not generate a thrust to support the weight of the fine motion stage 15, and need only generate a minimal force to correct a shift from a target position.

Even in a stage having the configuration of coarse and fine motions using such a planar motor, heat generated by a motor upon great acceleration is problematic. To solve this problem, the alignment apparatus according to the third embodiment comprises a coarse motion repulsive force generator and fine motion repulsive force generator shown in FIG. 10A. Coarse motion repulsion movable elements 7 each including a coarse motion movable magnet holder 8 and coarse motion movable magnet 9 are fixed on the front and back sides of the coarse motion stage 4. The coarse motion movable magnet 9 is a plate-like permanent magnet magnetized in the vertical direction. The coarse motion repulsion movable element 7 interacts with a coarse motion repulsion stator 10 arranged on a base guide 2 to apply a repulsive force to the coarse motion stage 4, thereby accelerating or decelerating it. Similarly, fine motion repulsion movable elements 27 each including a fine motion movable magnet holder 28 and fine motion movable magnet 29 are fixed on the front and back sides of the fine motion stage 15. The fine motion movable magnet 29 is a plate-like permanent magnet magnetized in the vertical direction. The fine motion repulsion movable element 27 interacts with a fine motion repulsion stator 30 arranged on the base guide 2 to apply a repulsive force to the fine motion stage 15, thereby accelerating or decelerating it. The accelerating and decelerating motions of the coarse motion stage 4 and fine motion stage 15 using the repulsive force generators are the same as those in the first embodiment.

With this arrangement, the permanent magnets apply both accelerating and decelerating forces to the coarse motion stage 4 and fine motion stage 15 using repulsive forces. This makes it possible to minimize electric power to be supplied to a coarse motion linear motor (not shown) and the planar motor 43, thus suppressing heat generation. It is also possible to save power.

Embodiment of Exposure Apparatus

Figure 12:
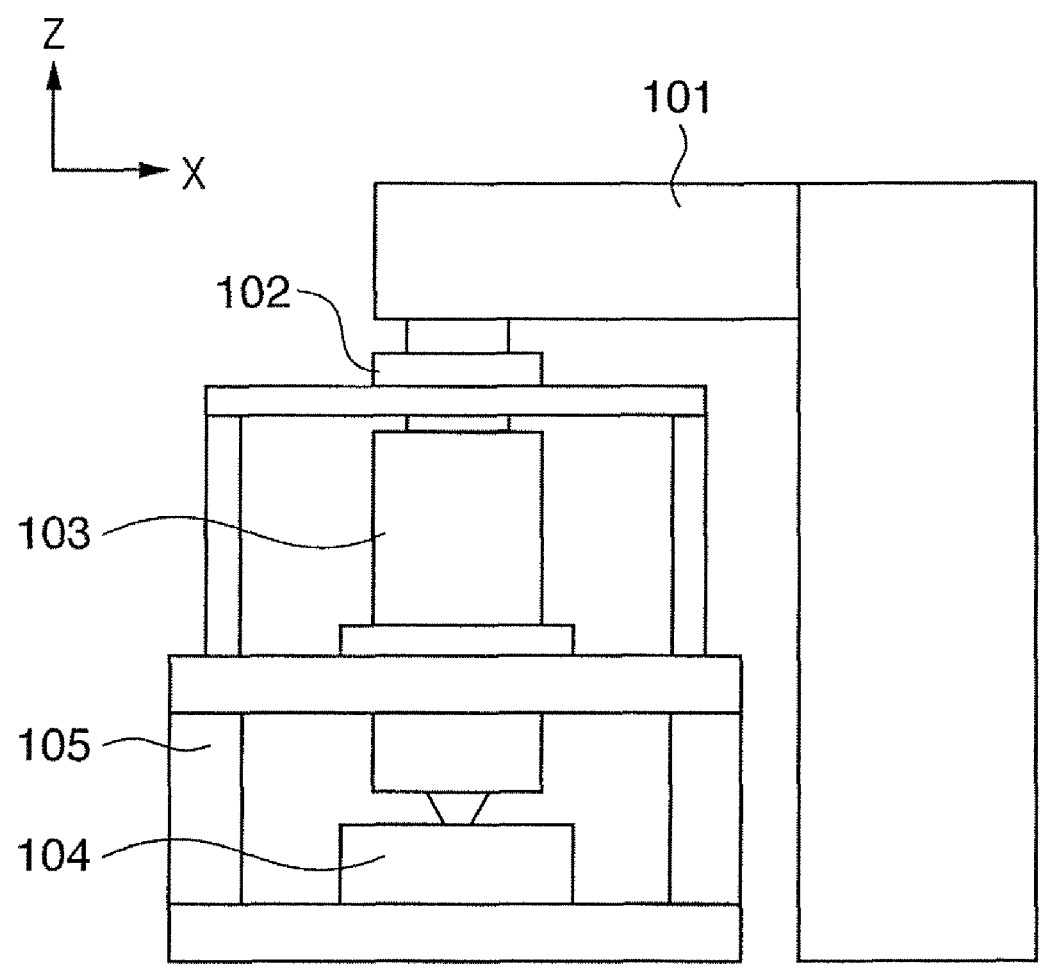
FIG. 12 is a view for explaining an exposure apparatus.

An exemplary exposure apparatus to which a stage apparatus according to the present invention is applied will be explained below. As shown in FIG. 12, the exposure apparatus comprises an illumination device 501, a reticle stage 502 which mounts a reticle, a projection optical system 503, and a substrate stage 504 which mounts a substrate. The exposure apparatus projects and transfers by exposure a circuit pattern formed on the reticle onto the substrate, and may be of a step & repeat projection exposure scheme or a step & scan projection exposure scheme.

The illumination device 501 illuminates the reticle on which the circuit pattern is formed, and comprises a light source unit and illumination optical system. The light source unit uses, for example, a laser as a light source. The laser can be, for example, an ArF excimer laser with a wavelength of about 193 nm, a KrF excimer laser with a wavelength of about 248 nm, or an $F_2$ excimer laser with a wavelength of about 153 nm. However, the type of laser is not particularly limited to an excimer laser. For example, a YAG laser may be used and the number of lasers is also not particularly limited. When the light source is a laser, a light beam shaping optical system and incoherent optical system are preferably used. The light beam shaping optical system shapes a collimated light beam emitted by the laser light source into a desired beam shape. The incoherent optical system converts a coherent laser light beam into an incoherent one. The light source which can be used for the light source unit is not particularly limited to a laser, and can use one or a plurality of lamps such as a mercury lamp or xenon lamp.

The illumination optical system illuminates a mask, and includes, for example, a lens, mirror, light integrator, and stop. The projection optical system 503 can be, for example, an optical system including a plurality of lens elements alone, an optical system including a plurality of lens elements and at least one concave mirror, an optical system including a plurality of lens elements and at least one diffraction optical element, or an optical system of a total reflection mirror type.

The reticle stage 502 and substrate stage 504 can be moved by linear motors, and are used for, for example, the stage apparatuses according to the first to third embodiments. When the exposure apparatus is of a step & scan projection exposure scheme, these stages move in synchronism with each other.

This exposure apparatus can be used to manufacture a device on which a micropattern is formed, for example, a semiconductor device such as a semiconductor integrated circuit, a micromachine, or a thin film magnetic head.

Figure 13:
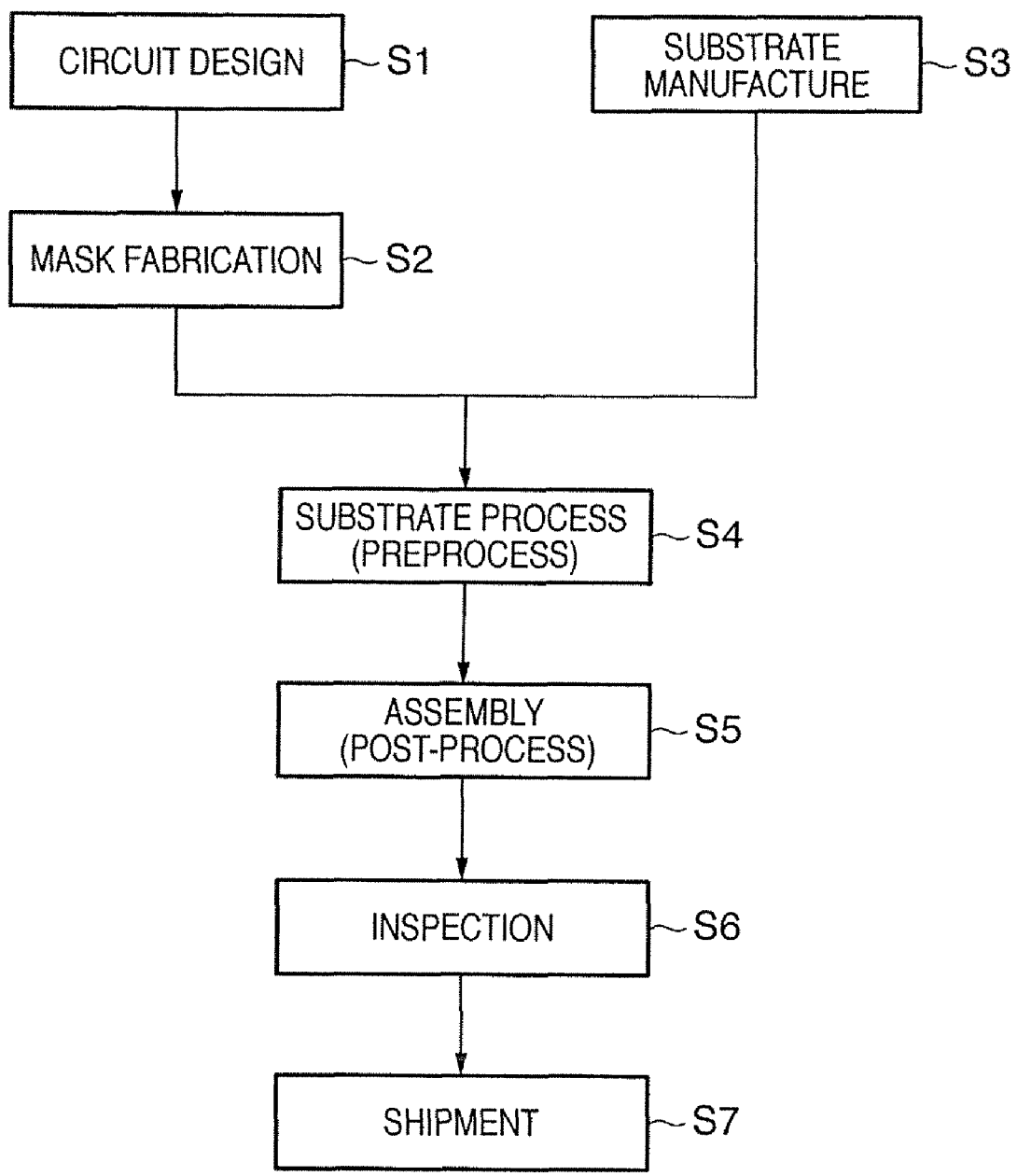
FIG. 13 is a flowchart for explaining the device manufacture using an exposure apparatus.

An embodiment of a device manufacturing method using the above-described exposure apparatus will be explained next with reference to FIGS. 13 and 14. FIG. 13 is a flowchart for explaining the manufacture of a device (e.g., a semiconductor chip such as an IC or LSI, an LCD, or a CCD). A semiconductor chip manufacturing method will be exemplified here.

In step S1 (circuit design), the circuit of a semiconductor device is designed. In step S2 (mask fabrication), a reticle (mask) is fabricated on the basis of the designed circuit pattern. In step S3 (substrate manufacture), a substrate is manufactured using a material such as silicon. In step S4 (substrate process) called a preprocess, the above-described exposure apparatus forms an actual circuit on the substrate by lithography using the reticle and substrate. In step S5 (assembly) called a post-process, a semiconductor chip is formed using the substrate manufactured in step S4. This step includes an assembly step (dicing and bonding) and packaging step (chip encapsulation). In step S6 (inspection), the semiconductor device manufactured in step S5 undergoes inspections such as an operation confirmation test and durability test. After these steps, the semiconductor device is completed and shipped in step S7.

Figure 14:
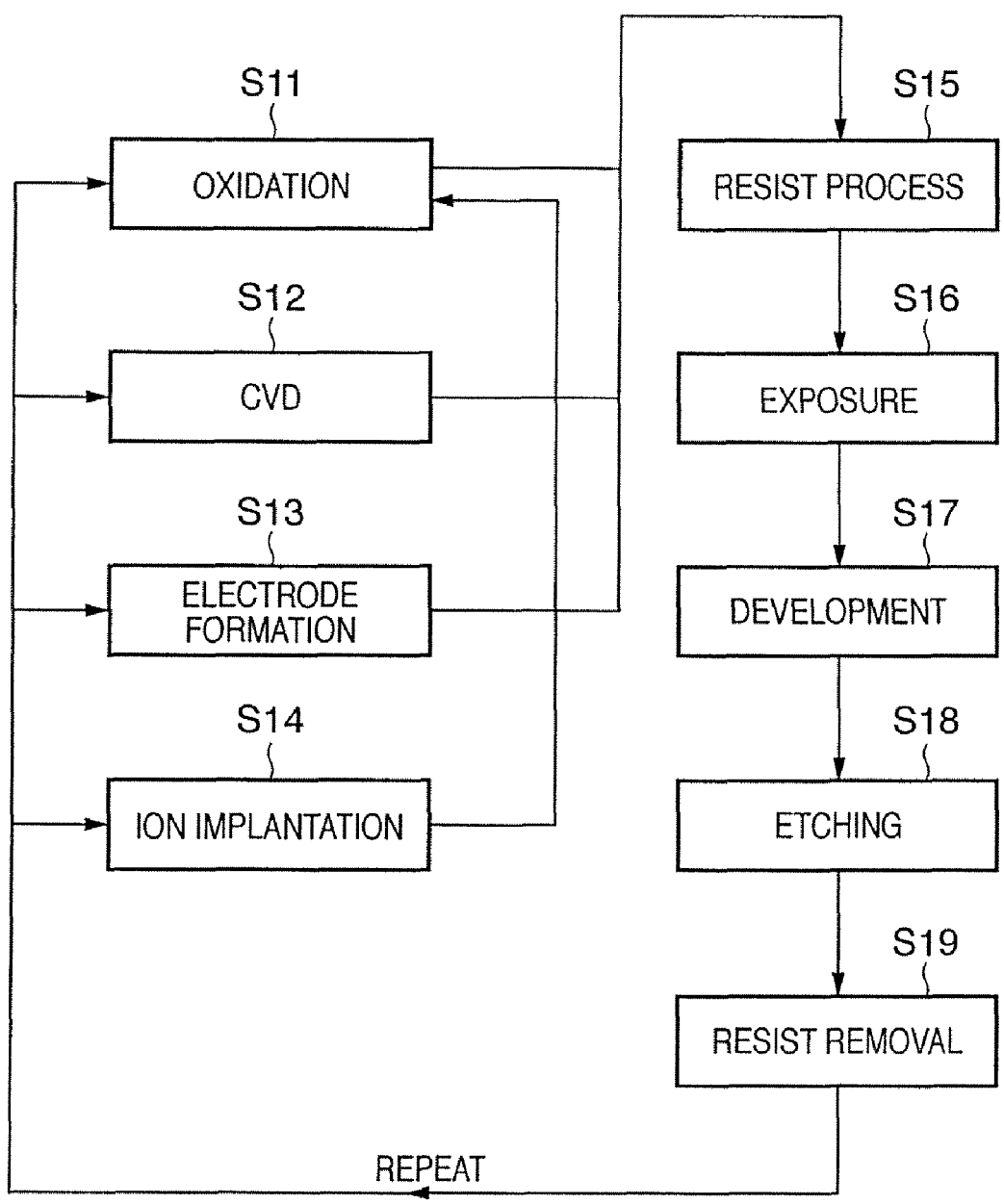
FIG. 14 is a flowchart illustrating details of the substrate process in step S4 of the flowchart shown in FIG. 13.

FIG. 14 is a flowchart illustrating details of the substrate process in step S4. In step S11 (oxidation), the substrate surface is oxidized. In step S12 (CVD), an insulating film is formed on the substrate surface. In step S13 (electrode formation), an electrode is formed on the substrate by deposition. In step S14 (ion implantation), ions are implanted into the substrate. In step S15 (resist process), a photosensitive agent is applied on the substrate. In step S16 (exposure), the exposure apparatus transfers the circuit pattern of the mask onto the substrate by exposure. In step S17 (development), the exposed substrate is developed. In step S18 (etching), portions other than the developed resist image are etched. In step S19 (resist removal), any unnecessary resist remaining after etching is removed. By repeating these steps, a multilayered structure of circuit patterns is formed on the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-353175 filed Dec. 27, 2006 and Japanese Patent Application No. 2007-26587 filed Dec. 18, 2007, which are hereby incorporated by reference herein in their entirety.

What is claimed is:

1. A stage apparatus comprising:
a first stage;
a first actuator which drives said first stage in a first direction;
a second stage mounted on said first stage;
a second actuator which drives said second stage such that said second stage moves relative to said first stage;
a first unit including a first movable magnet arranged at an end of said first stage in the first direction, and a first stationary magnet which faces said first movable magnet and generates a repulsive force against said first movable magnet when said first stage is positioned at one end of a stroke region in which said first stage moves in the first direction; and
a second unit including a second movable magnet arranged at two ends of said second stage in the first direction, and a second stationary magnet which faces said second movable magnet and generates a repulsive force against said second movable magnet when said second stage is positioned at the one end of the stroke region in which said first stage moves in the first direction;
wherein a ratio between the repulsive force generated by said first unit and the repulsive force generated by said second unit is equal to a ratio between a mass of said first stage and a mass of said second stage.

2. The apparatus according to claim 1, wherein a dimension of said first movable magnet in the first direction is equal to a dimension of said second movable magnet in the first direction, and a ratio between a dimension of said first movable magnet in a direction perpendicular to the first direction and a dimension of said second movable magnet in the direction perpendicular to the first direction is equal to the ratio between the mass of said first stage and the mass of said second stage.

3. The apparatus according to claim 1, wherein a dimension of said first stationary magnet in the first direction is equal to a dimension of said second stationary magnet in the first direction, and a ratio between a dimension of said first stationary magnet in a direction perpendicular to the first direction and a dimension of said second stationary magnet in the direction perpendicular to the first direction is equal to the ratio between the mass of said first stage and the mass of said second stage.

4. The apparatus according to claim 1, wherein said second actuator drives said second stage in six axial directions.

5. An exposure apparatus which projects a pattern of a reticle onto a substrate via a projection optical system and exposes the substrate, said apparatus comprising a stage apparatus defined in claim 1, which supports the reticle.

6. A stage apparatus comprising:
a first stage;
a first actuator which drives said first stage in a first direction;
a second stage mounted on said first stage;
a second actuator which drives said second stage such that said second stage moves relative to said first stage;
a first unit including a first movable magnet arranged at an end of said first stage in the first direction, and a first stationary magnet which faces said first movable magnet and generates a repulsive force against said first movable magnet when said first stage is positioned at one end of a stroke region in which said first stage moves in the first direction; and
a second unit including a second movable magnet arranged at two ends of said second stage in the first direction, and a second stationary magnet which faces said second movable magnet and generates a repulsive force against said second movable magnet when said second stage is positioned at the one end of the stroke region in which said first stage moves in the first direction;
wherein a line of action of the repulsive force generated by said first unit runs through the position of the overall center of gravity of said first stage and a member mounted on said first stage, and a line of action of the repulsive force generated by said second unit runs through the position of the overall center of gravity of said second stage and a member mounted on said second stage.

7. A stage apparatus comprising:
a first stage;
a first actuator which drives said first stage in a first direction;
a second stage mounted on said first stage;
a second actuator which drives said second stage such that said second stage moves relative to said first stage;
a first unit including a first movable magnet arranged at an end of said first stage in the first direction, and a first stationary magnet which faces said first movable magnet and generates a repulsive force against said first movable magnet when said first stage is positioned at one end of a stroke region in which said first stage moves in the first direction; and
a second unit including a second movable magnet arranged at two ends of said second stage in the first direction, and a second stationary magnet which faces said second movable magnet and generates a repulsive force against said second movable magnet when said second stage is positioned at the one end of the stroke region in which said first stage moves in the first direction;
wherein a difference between a force applied to said first stage by said first unit and a force applied to said second stage by said second unit is changed using at least one of said first actuator and said second actuator.

8. A stage apparatus comprising:
a first stage;
a first actuator which drives said first stage in a first direction;

a second stage mounted on said first stage;
a second actuator which drives said second stage such that said second stage moves relative to said first stage;
a first unit including a first movable magnet arranged at an end of said first stage in the first direction, and a first stationary magnet which faces said first movable magnet and generates a repulsive force against said first movable magnet when said first stage is positioned at one end of a stroke region in which said first stage moves in the first direction; and
a second unit including a second movable magnet arranged at two ends of said second stage in the first direction, and a second stationary magnet which faces said second movable magnet and generates a repulsive force against said second movable magnet when said second stage is positioned at the one end of the stroke region in which said first stage moves in the first direction; and
a stationary magnet driving unit which changes positions of said first stationary magnet and second stationary magnet.

9. A device manufacturing method comprising the steps of:
exposing a substrate using an exposure apparatus, which projects a pattern of a reticle onto a substrate via a projection optical system and exposes the substrate, the exposure apparatus including
a first stage;
a first actuator which drives said first stage in a first direction;
a second stage mounted on said first stage;
a second actuator which drives said second stage such that said second stage moves relative to said first stage;
a first unit including a first movable magnet arranged at an end of said first stage in the first direction, and a first stationary magnet which faces said first movable magnet and generates a repulsive force against said first movable magnet when said first stage is positioned at one end of a stroke region in which said first stage moves in the first direction; and
a second unit including a second movable magnet arranged at two ends of said second stage in the first direction, and a second stationary magnet which faces said second movable magnet and generates a repulsive force against said second movable magnet when said second stage is positioned at the one end of the stroke region in which said first stage moves in the first direction;
wherein a ratio between the repulsive force generated by said first unit and the repulsive force generated by said second unit is equal to a ratio between a mass of said first stage and a mass of said second stage; and
developing the exposed substrate.

* * * * *